United States Patent [19]
Davis et al.

[11] Patent Number: 5,789,984
[45] Date of Patent: Aug. 4, 1998

[54] RF POWER AMPLIFIERS

[75] Inventors: Michael Colin Davis, Poole Dorset; Martin Victor Whittle, Hampshire, both of England

[73] Assignee: Roke Manor Research Limited, Hampshire, England

[21] Appl. No.: 742,744

[22] Filed: Nov. 1, 1996

[30] Foreign Application Priority Data

Nov. 1, 1995 [GB] United Kingdom ............... 9522329

[51] Int. Cl.$^6$ .................................................. H03G 3/30
[52] U.S. Cl. .................................... 330/279; 330/285
[58] Field of Search ........................ 330/85, 129, 207 P, 330/279, 285, 298; 455/115, 117

[56] References Cited

U.S. PATENT DOCUMENTS

| | | |
|---|---|---|
| 4,860,154 | 8/1989 | Fazlollahi .................... 330/298 X |
| 5,012,202 | 4/1991 | Taylor .................................. 330/284 |
| 5,442,322 | 8/1995 | Kornfeld et al. ................... 330/285 |
| 5,497,125 | 3/1996 | Rogds ........................... 330/285 X |

*Primary Examiner*—Steven J. Mottola
*Attorney, Agent, or Firm*—Hill & Simpson

[57] ABSTRACT

A radio frequency (r.f.) amplifier power control system comprises an r.f. power amplifier for supplying r.f. transmission power to an antenna, a current sensing resistor via which operating current is fed to the power amplifier, a differential amplifier having a first input terminal to which a feed-back voltage derived from the sensing resistor indicative of r.f. transmission power is fed and a second input terminal to which a reference voltage is fed thereby to produce, in the presence of a voltage difference between the feed-back voltage and the reference voltage, a control voltage for the power amplifier, whereby the transmission power is controllable in dependence upon the reference voltage, and a shunt which is fed with current from the sensing resistor. The impedance of the shunt is arranged to vary responsively to the control voltage.

8 Claims, 2 Drawing Sheets

1

RF POWER AMPLIFIERS

BACKGROUND OF THE INVENTION

1. Field of the Invention

The present invention relates generally to the field of telecommunications, and, more particularly, the present invention relates to radio frequency (r.f.) amplifier power control systems. More particularly, but not exclusively, it relates to systems for use in r.f. transmitters designed in accordance with the "Groupe Speciale Mobile" (GSM) specification which is a mobile radio standard well known to those skilled in the art.

2. Description of the Related Art

Many radio transmitters including GSM mobile unit transmitters are required to be switched on and off in a controlled fashion. In known GSM systems, the switching on and off of a mobile transmitter to control the duty cycle and transmitted power may conveniently be effected using a power control loop wherein a power amplifier control signal is derived by comparing a signal indicative of transmitter output power with a reference voltage which is derived dynamically depending upon timing, power output and frequency spectrum requirements.

One of the problems with presently known power control loops is that the dynamic control range tends to be insufficient with the result that if the loop characteristics are set to handle the highest transmission power envisaged, then the loop operates unsatisfactorily at small transmitter output powers and vice-versa as will hereinafter be explained in greater detail.

SUMMARY OF THE INVENTION

It is therefore an important object of the present invention to provide an r.f. power amplifier control system which operates satisfactorily at both the upper and lower limits of its power output range. According to the present invention, an r.f. amplifier power control system comprises an r.f. power amplifier for supplying r.f. transmission power to an antenna and a current sensing impedance via which operating current is fed to the power amplifier. A differential amplifier has a first input terminal to which a feed-back voltage derived from sensing an impedance indicative of r.f. transmission power is fed and a second input terminal to which a reference voltage is fed. This arrangement produces, in the presence of a voltage difference between the feed-back voltage and the reference voltage, a control voltage which varies depending upon the output of the power amplifier which is controlled such that the voltage difference tends to be nullified. The transmission power is thus controllable depending upon the reference voltage, and a shunt which is fed with current from the sensing impedance. The impedance of the shunt is arranged to vary responsively to the control voltage. The sensing impedance may be a resistor.

Thus, the rate of change of feed-back voltage versus power amplifier control voltage is effectively increased due to current in the shunt. The rate of change of feed-back voltage increase is proportionately greater at small output powers whereby the dynamic control range of the system is effectively enhanced.

The shunt may comprise a transistor which is arranged to shunt the power amplifier. The control voltage is applied to a base terminal of the transistor, preferably via a resistor. A collector terminal of the transistor may be connected via a load component to the sensing resistor and an emitter terminal of the transistor may be coupled via a further

2 resistor to ground. The base of the transistor is coupled via a series resistor to an output terminal of the differential amplifier. The system may further include a transmitter antenna which is fed from the power amplifier. The system may also form a part of a mobile unit in a GSM mobile radio system.

BRIEF DESCRIPTION OF THE DRAWINGS

One embodiment of the invention will now be described by way of example only with reference to the accompanying drawings in which.

DETAILED DESCRIPTION OF THE PREFERRED EMBODIMENTS

Figure 1:
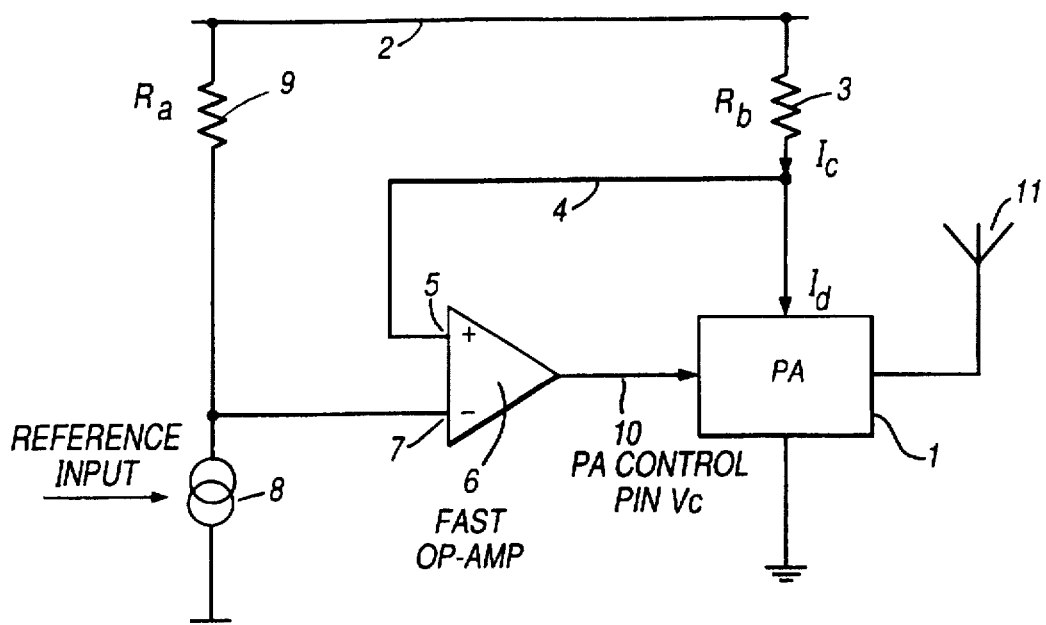
FIG. 1 is a schematic block/circuit diagram of a known r.f. power amplifier control system.

As shown in FIG. 1, a power amplifier control system comprises a power amplifier 1 which is fed with current from a supply rail 2 via a sensing resistor 3. The sensing resistor 3 is coupled via a feed-back line 4 to one input terminal 5 of a differential amplifier 6. The other input terminal 7 of the differential amplifier 6 is fed from a reference current source 8 and a load resistor 9 which is coupled to the power supply rail 2, and across which a reference voltage is developed. A control voltage which is present on an output line 10 of the differential amplifier 6 is fed to the power amplifier 1. The power amplifier 1 is arranged to feed an antenna 11. The power fed to the antenna 11 is controlled in accordance with a reference voltage produced by the reference current source 8, which is applied to the input terminal 7 of the differential amplifier 6. Thus, in operation of the arrangement, if the reference voltage applied to the input terminal 7 of the differential amplifier 6 is increased, the control voltage on the line 10 is increased so that the r.f. power output to the antenna 11 is increased accordingly whereby the voltage dropped across the sensing resistor 3 increases. The power output to the antenna 11 is thus ramped up/down until the voltages on the input terminals 5 and 7 of the differential amplifier 6 are equal whereby the control voltage on the line 10 tends to a steady state value.

A problem with this known control system is that the sensing resistor 3 must be of a very small resistance so that the voltage dropped across it is not significant and thus at small power outputs a very small feed-back voltage is produced on the line 4. It will be appreciated therefore that the specification of the differential amplifier, which is used to compare the feed-back signal at the terminal 5 with the reference signal at the terminal 7, must accommodate a wide range of feed-back voltages at the terminal 5 as would correspond to the voltages present at maximum and minimum power outputs respectively. In practice these requirements cannot be satisfactorily met, since if the system is arranged to operate satisfactorily for high outputs then during conditions of low output the feed-back signals on the line 4 become too small and the differential amplifier is unable to provide sufficient gain-bandwidth.

Figure 2:
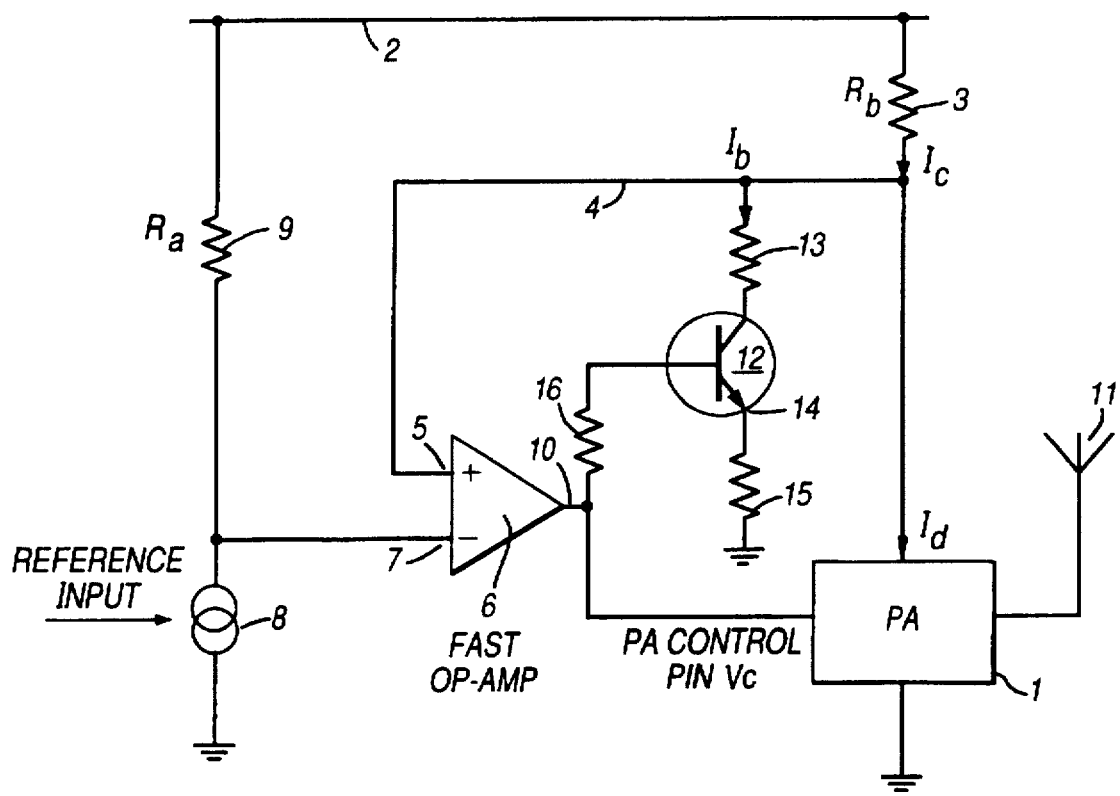
FIG. 2 is a schematic block/circuit diagram of an r.f. power amplifier control system according to the present invention.

In order to overcome this problem, a system as shown in FIG. 2 is provided wherein parts corresponding to those shown in FIG. 1 bear as appropriate the same numerical designations. The arrangement of FIG. 2 corresponds substantially to FIG. 1 with the exception that the power amplifier 1 is shunted by a transistor 12, the collector of which is coupled via a resistor 13 to the line 4 and the emitter 14 of which is grounded via a resistor 15. The base of the transistor 12 is coupled to the control line 10 via resistor 16.

Figure 3:
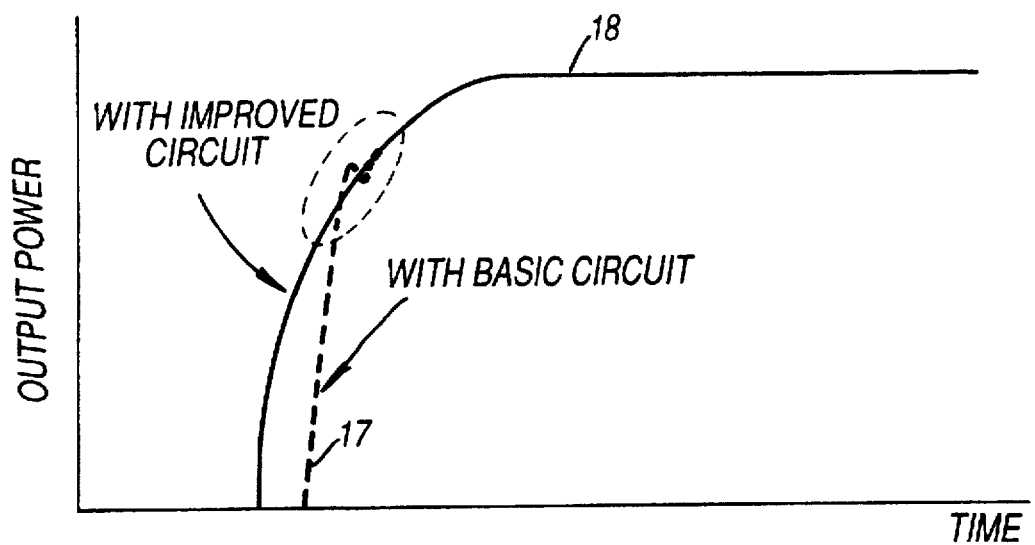
FIG. 3 is a graph showing output power characteristics corresponding to the systems shown in FIGS. 1 and 2.

In the operation of the system, current drawn by the transistor 12 is determined by the control voltage on the line 10. It will be appreciated that a current $I_c$ which passes through the resistor 3 will be equal to a current $I_d$ which is drawn by the power amplifier 1 plus a current $I_b$ which is drawn by the transistor 12. It will be appreciated therefore that the current supplied via the resistor 3 to the power amplifier is increased, due to operation of the transistor, from $I_d$ to $I_d+I_b$. It will also be appreciated that at high output powers $I_d$ will be large whereas at low output powers $I_d$ will be relatively small whereby the transistor 12 has a proportionately greater effect at low powers and control at low powers is enhanced, such that the dynamic control range of the system is effectively increased. The effect of this is illustrated in FIG. 3 wherein broken line 17 corresponds to the power output envelope for the circuit of FIG. 1 and the line 18 represents the power envelope for the circuit shown in FIG. 2. The graph of FIG. 3 shows the manner in which the currents $I_b$, $I_c$ and $I_d$ vary with a control voltage $V_c$ present on the line 10.

It can be seen from FIG. 3 that with a system which comprises the circuit of FIG. 1, (dotted line 17) the output power tends to overshoot and is slower to respond to a change of reference voltage at the input 7 to the differential amplifier 6 whereas with the improved system as shown in FIG. 2, (line 18 of FIG. 3) response is much quicker and smoother.

Figure 4:
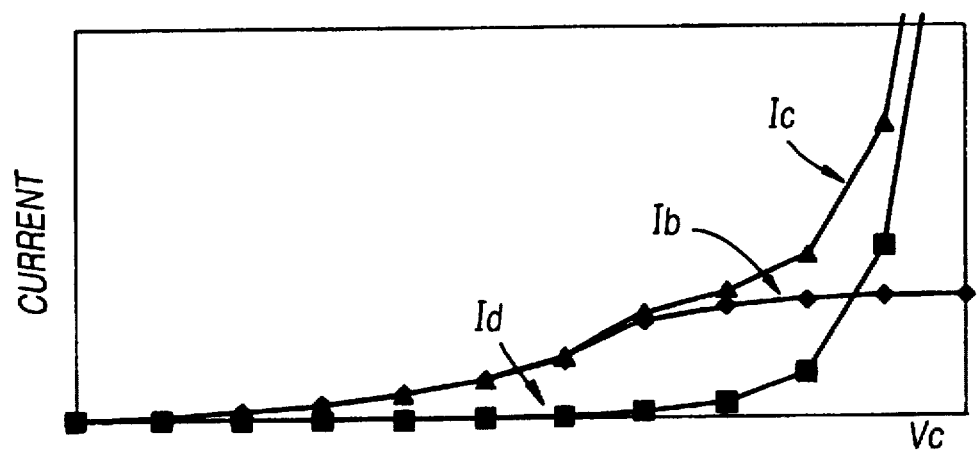
FIG. 4 is a further graph which illustrates operation of the system shown in FIG. 2.

As shown in FIG. 4 as the system is turned on initially, current drawn through the resistor 3 is supplied primarily to the transistor 12. However when the control voltage Vc on the line 10 is high enough, the current $I_d$ starts to rise, and rises faster than $I_b$. The speed of operation of a control circuit comprising the differential amplifier 6, the resistors 3, 13, 15 and 16, the power amplifier 1 and the transistor 12 at any time is directly related to the slope of the $I_d$/Vc characteristic curve. It is apparent from FIG. 4 that the slope of this characteristic curve increases around the point when the power amplifier starts to switch on. Without the additional current path provided by the transistor 12, the slope of the $I_d$/Vc characteristic would be approximately zero around this point, thus causing slow operation of the loop.

Various modifications may be made to the arrangement shown in FIG. 2 without departing from the scope of the invention. For example, although in the present example the differential amplifier 6 is a fast operational amplifier, any other kind of suitable differential amplifier may be used. Also, although the shunt in the present example is a transistor 12, in alternative arrangements, any other suitable type of controllable shunt may be used which would provide appropriate impedance changes as required.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. An r.f. amplifier power control system, comprising:
   an r.f. power amplifier for supplying r.f. transmission power to an antenna;
   a current sensing impedance having an output which feeds operating current to the power amplifier;
   a differential amplifier having a first input terminal connected to a feed-back voltage derived from the sensing impedance and a second input terminal to which a reference voltage is connected;
   the differential amplifier having an output control voltage connected to the input of the power amplifier; and
   a shunt connected to the output of the sensing impedance, the impedance of the shunt is arranged to vary in response to a value of the control voltage.

2. The r.f. amplifier power control system of claim 1, wherein the sensing impedance is a resistor.

3. The r.f. amplifier power control system of claim 1, wherein the shunt comprises a transistor and the control voltage is applied to a base of the transistor.

4. The r.f. amplifier control system as claimed in claim 3, wherein a collector of the transistor is connected to the sensing impedance and an emitter of the transistor is coupled via a further resistor to ground, the base of the transistor being coupled via a series resistor to an output terminal of the differential amplifier.

5. The r.f. amplifier control system of claim 1, further comprising:
   a transmitter antenna connected to an output from the power amplifier.

6. The r.f. amplifier control system of claim 1, wherein the power amplifier is a part of a mobile unit transmitter for a mobile radio system.

7. The r.f. amplifier control system of claim 6, wherein the mobile radio system is a GSM mobile radio system.

8. A method of controlling an r.f. amplifier comprising the steps of:
   applying an operating current to a power amplifier;
   generating a feedback signal indicative of the operating current;
   generating a control signal based on a comparison of the feedback signal with a reference;
   applying the control signal to the power amplifier; and
   controlling a shunt connected to the operating current based on a value of the control signal.

* * * * *